(12) United States Patent
Edinger

(10) Patent No.: US 12,237,140 B1
(45) Date of Patent: Feb. 25, 2025

(54) ELECTRON GUN AND SYSTEM AND METHOD USING ELECTRON GUN

(71) Applicant: Ralf Edinger, Richmond (CA)

(72) Inventor: Ralf Edinger, Richmond (CA)

(73) Assignee: Ralf Edinger, Richmond (CA)

( * ) Notice: Subject to any disclaimer, the term of this patent is extended or adjusted under 35 U.S.C. 154(b) by 0 days.

(21) Appl. No.: 18/720,024

(22) PCT Filed: Dec. 20, 2022

(86) PCT No.: PCT/CA2022/051872
§ 371 (c)(1),
(2) Date: Jun. 14, 2024

(87) PCT Pub. No.: WO2023/122831
PCT Pub. Date: Jul. 6, 2023

Related U.S. Application Data

(60) Provisional application No. 63/294,303, filed on Dec. 28, 2021.

(51) Int. Cl.
*H01J 37/067* (2006.01)
*B33Y 10/00* (2015.01)
*H01J 37/147* (2006.01)

(52) U.S. Cl.
CPC .......... *H01J 37/067* (2013.01); *B33Y 10/00* (2014.12); *H01J 37/1475* (2013.01); *H01J 2237/06308* (2013.01); *H01J 2237/1526* (2013.01); *H01J 2237/3128* (2013.01)

(58) Field of Classification Search
CPC ................................... H01J 37/067
See application file for complete search history.

(56) References Cited

U.S. PATENT DOCUMENTS

| | | | |
|---|---|---|---|
| 10,166,628 B2 | 1/2019 | Kazuya | |
| 10,525,547 B2 | 1/2020 | Ekberg | |
| 10,744,562 B2 | 8/2020 | Frontera et al. | |
| 2024/0170248 A1* | 5/2024 | Podhola | ............... H01J 29/563 |

OTHER PUBLICATIONS

International Search Report in International Application No. PCT/CA2022/051872 issued Mar. 14, 2023.
Written opinion on Patentability of International Application No. PCT/CA2020/051872 issued Mar. 14, 2023.

\* cited by examiner

*Primary Examiner* — Joseph L Williams

(57) ABSTRACT

Examples of an electron gun with a moving cathode station and a moving anode station are described. The moving cathode has a driver that moves the station and comprises a plurality of cathodes with a plurality of bias cups to control a thermal electron emission region by applying a bias voltage to the bias cup. The moving anode station comprises a plurality of anodes and has driver to move the anode station such that a position of each anode is synchronized with a positioned of a respective matching pair of cathode and bias cup. A controller that is in communication with the anode and cathode moving stations controls the bias voltage and the drivers to control the amount of thermal electrons and to synchronize and align a predetermined cathode with a predetermined anode thus controlling the size and parameters of the generated electron beam.

21 Claims, 13 Drawing Sheets

ELECTRON GUN AND SYSTEM AND METHOD USING ELECTRON GUN

TECHNICAL FIELD

The present disclosure relates to an electron gun and a system and a method for additive manufacturing using the electron gun.

BACKGROUND

An electron gun is used to produce a high energy beam of electrons, which when focused over a metal powder surface can supply enough energy to produce melting and bonding of the metal particles. The electron gun has a cathode and anode, and the distance and electrical potential differences between these two components determines the energy of the electrons. The electron gun further comprises a bias cup positioned between the cathode to reduce the electron beam current. Both the cathode and the bias cup have small gaps through which the electron beam must travel and these openings act as filters to remove some electrons, ensuring that the electron beam is of a precise and uniform size. The negative potential of the bias cup generates an electric field around the cathode and reduces the size of the cathode electron emission opening, thereby reducing the number of electrons passing through. Increasing the negative potential on the bias cup will further reduce the electron emission current. Typically, the electron gun has a set of cathode and bias cup with preset openings therefore are capable to produce an electron beam with a single and uniform size.

Additive manufacturing technology, such as an electron-beam powder bed fusion (EB-PBF) technology, takes place under vacuum, in which products are manufactured by melting metal powder, layer by layer, with an electron beam as a heat source. The EB-PBF process usually consists of three major steps: 1) preheating a powder bed workpiece to higher temperature depending on the material/metal using an electron beam energy 2) depositing and spreading a thin layer (in microns) of the metal powder on the powder bed, and 3) melting the powder using the electron beam. The interaction between the electron beam heat input and the metal powder material produces the melt pool. The physical characteristics of the melt pool, such as the size and depth, are uniform and proportional to the electron beam size, which is controlled by the electrical potential applied to the cathode and bias cup and the focus coil current. During the EB-PBF process the melt pool shape and aspect ratio cannot be altered because there is only one set of cathode/bias cup and anode so the electron beam properties generated by such electron gun are constant.

SUMMARY

In one aspect, an electron beam gun is provided. The electron gun comprises a moving cathode station that comprises a plurality of cathodes positioned on the moving station at a predetermined distance. Each of the plurality of cathodes is heated by a heating power supply such that it emits thermal electrons from its tip. A plurality of bias cups are operatively coupled to a power supply to control a thermal electron emission region by applying a bias voltage to the bias cup. Each of the plurality of bias cups are electrically coupled to a respective cathode forming a pair of cathode and bias cup. Each of the plurality of bias cups has an opening with a predetermined size to control the number of the thermal electrums passing through the opening of the respective bias cup and to focus the thermal electrons. A driver that is in communication with the moving cathode station is provided to move the cathode station. The electron gun also comprises a moving anode station that comprises a plurality of anodes having a base portion with a base opening and an upper portion that extends upwardly from a base portion and that has a focus opening to focus the thermal electrons accelerated from the cathode through the anode's base opening. An anode station driver is in communication with the moving anode station to move the anode station such that a position of each anode is synchronized with a positioned of a respective matching pair of cathode and bias cup to generate an electron beam with predetermined size and parameters determined by the cathode surface and bias cup opening. A controller that is in communication with the anode and cathode moving stations and with the power supply controls the bias voltage and the drivers to control the amount of thermal electrons and to synchronize and align a predetermined cathode and bias cup pair with a predetermined anode, thus controlling the size and parameters of the generated electron beam.

In one aspect, a deflection coil is provided. The deflection coil is positioned outside a beam column and is coaxial with the electron beam. The deflection coil is operatively coupled to a coil power amplifier to get excitation current supply. When the deflection coil is excited it generates electromagnetic force that is applied to the electron beam to adjust a position of the electron beam when impinging on a sample. The deflection coil is a Cartesian deflection coil and comprises a X-deflection coil system that is in communication with a X-deflection coil current amplifier configured to deflect the electron beam position in a X-direction, and a Y-deflection coil system that is in communication with a Y-deflection coil current amplifier configured to deflect the electron beam position in a Y-direction. Each of the X-deflection coil system and the Y-deflection coil system comprise a pair of coils that are parallel or almost parallel to each other such that the two pair of coils are perpendicular or almost perpendicular to each other. The Cartesian deflection coil further comprises a rectangular base with four sides and an opening surrounding and coaxial with the beam column. The coils of the X-deflection coil system are connected to respective side of the base in series in X-axis and the coils of the Y-deflection coil system are connected to respective side of the base in series in Y-axis. Each of the coils are connected to the base at their respective first end and hang therefrom. A position adjusting system configured to connect the two pair of the deflection coils to the base and to adjust an angular position of the coils with respect to the base is also provided, such that a magnetic field (lines) generated by the X-deflection coils is perpendicular to a magnetic field (lines) generated by the Y-deflection coils therefore adjusting a magnetic center of the Cartesian deflection coil system to align the electron beam axis to a beam gun coordinating system.

In another aspect, an electron beam gun is provided that comprises a single cathode/bias cup system and an anode configured to emit and accelerated thermal electrons along the beam column. The electron gun further comprises a deflection coil that is positioned outside the beam column and is coaxial with the electron beam. The deflection coil is operatively coupled to a coil power amplifier to get excitation current supply. When the deflection coil is excited it generates electromagnetic force that is applied to the electron beam to adjust a position of the electron beam when impinging on a sample. The deflection coil is a Cartesian deflection coil and comprises a X-deflection coil system that is in communication with a X-deflection coil current amplifier configured to deflect the electron beam position in a X-direction, and a Y-deflection coil system that is in communication with a Y-deflection coil current amplifier configured to deflect the electron beam position in a Y-direction. Each of the X-deflection coil system and the Y-deflection coil system comprise a pair of coils that are parallel or almost parallel to each other such that the two pair of coils are perpendicular or almost perpendicular to each other. The Cartesian deflection coil further comprises a rectangular base with four sides and an opening surrounding and coaxial with the beam column. The coils of the X-deflection coil system are connected to respective side of the base in series in X-axis and the coils of the Y-deflection coil system are connected to respective side of the base in series in Y-axis. Each of the coils are connected to the base at their respective first end and hang therefrom. A position adjusting system configured to connect the two pair of the deflection coils to the base and to adjust an angular position of the coils with respect to the base is also provided, such that a magnetic field (lines) generated by the X-deflection coils is perpendicular to a magnetic field (lines) generated by the Y-deflection coils therefore adjusting a magnetic center of the Cartesian deflection coil system to align the electron beam axis to a beam gun coordinating system.

In yet another aspect, an electron beam additive manufacturing system (EB-PBF) is provided. The system comprises the electron gun to generate a predetermined size of an electron beam, a building chamber with a build plate operatively coupled to the electron gun and a driver operatively coupled to the build plate to move the build plate in Z-direction. A powder bed is defined on the build plate and a powder feeder is operatively coupled to the powder bed to dispense a powdered material onto the powder bed. A controller that is in communication with the electron gun and the build plate driver is provided for setting the bias voltage and to control the drivers of the moving cathode and anode moving stations such that an electron beam with a predetermined size and parameters is generated, wherein a diameter of the electron beam focused onto the powdered bad varies producing melt pools with varying dimensions such that an electron beams generated with a bigger cathode and bias cup pair are focused at first focal positions on the powder bed and an electron beam generated with a finer cathode and bias cup pair are focused at second focal positions on the powder bed.

In addition to the aspects and embodiments described above, further aspects and embodiments will become apparent by reference to the drawings and study of the following detailed description.

BRIEF DESCRIPTION OF THE DRAWINGS

Throughout the drawings, reference numbers may be re-used to indicate correspondence between referenced elements. The drawings are provided to illustrate example embodiments described herein and are not intended to limit the scope of the disclosure. Sizes and relative positions of elements in the drawings are not necessarily drawn to scale. For example, the shapes of various elements and angles are not drawn to scale, and some of these elements are arbitrarily enlarged and positioned to improve drawing legibility.

DETAILED DESCRIPTION OF SPECIFIC EMBODIMENTS

A system and a method for advanced melting strategies required in additive manufacturing and welding using an electron gun for enhanced time-temperature control in a melt pool are described herein below.

Figure 1:
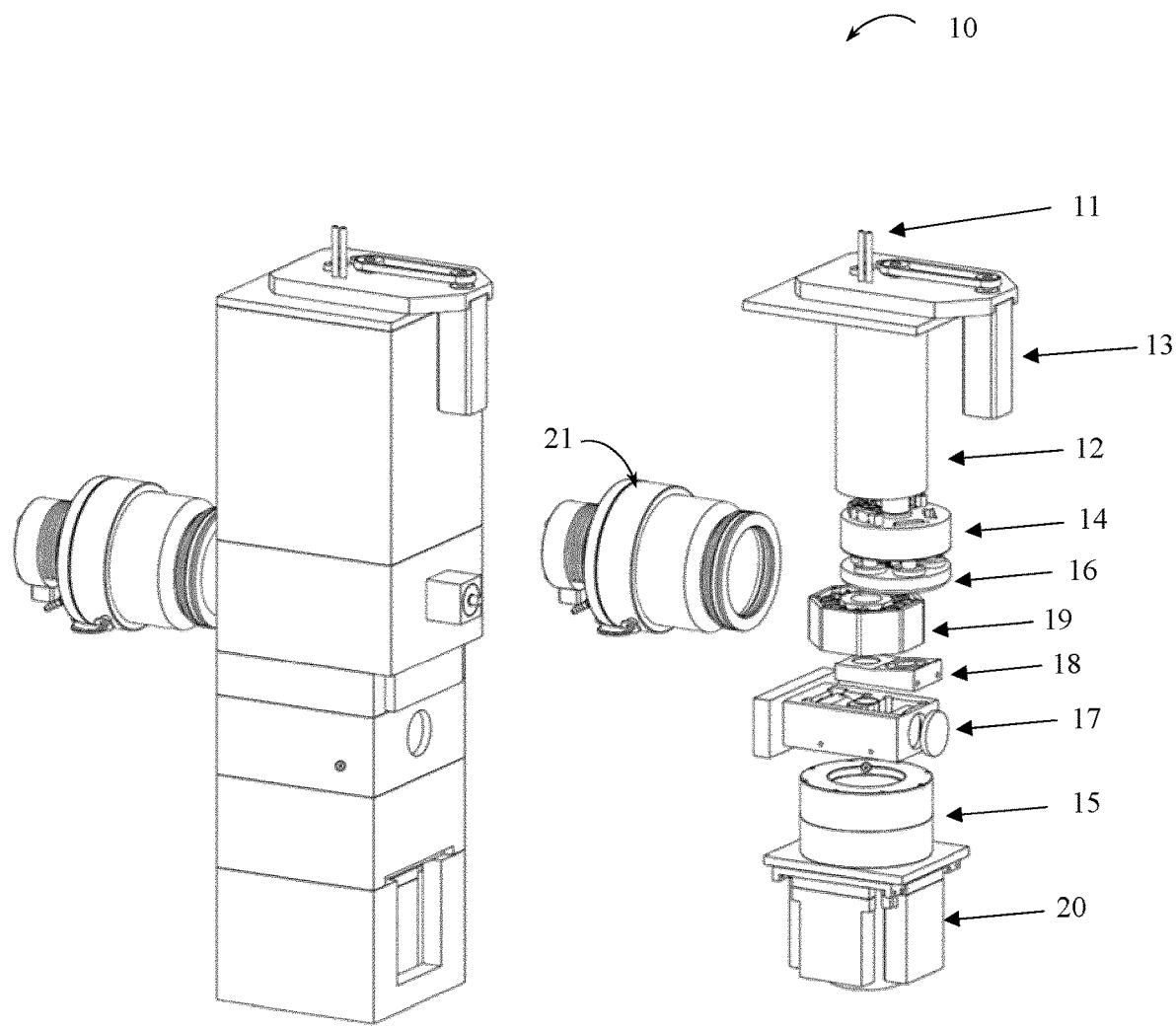
FIG. 1 left side is a perspective view of an example of an electron beam gun with an automated beam changing station according to an embodiment of the present invention and right side is a perspective view of some of inside components of the electron beam gun and the automated beam changing station.
Figure 2B:
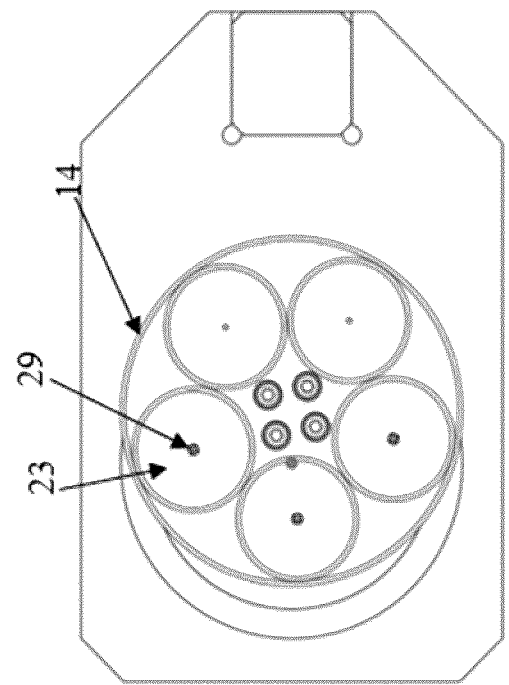
FIG. 2B is a bottom view of an example of a rotating cathode station.
Figure 2A:
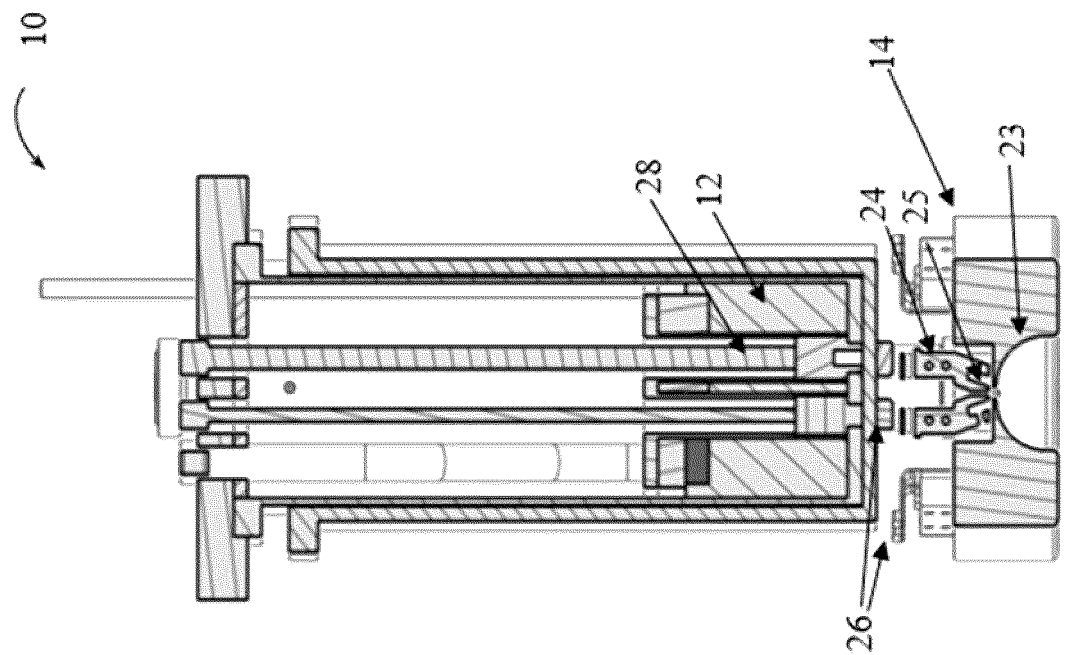
FIG. 2A is a partial cross-sectional view of an example of the electron beam gun of FIG. 1 showing a cathode station.
Figure 11:
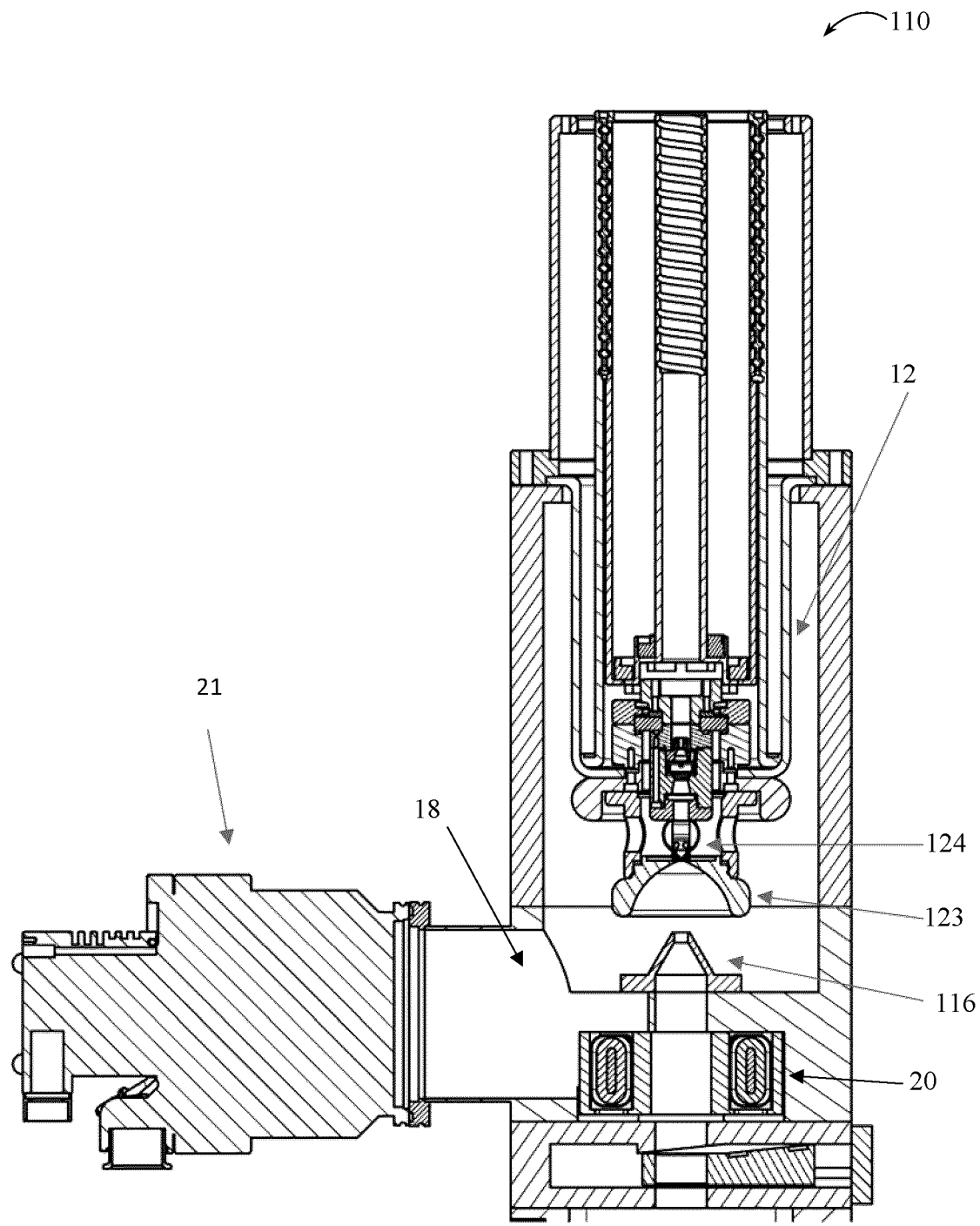
FIG. 11 is a cross sectional view of an example of the electron beam gun of the present invention with a single cathode-anode system.

FIG. 1 illustrates an electron beam gun 10 with an automated beam changer 13. The electron beam gun 10 comprises a moving cathode station 14 and a moving anode station 16, each of which can comprise plurality of cathodes and anodes such that the electron beam gun 10 can have multiple cathode-anode combinations and is able to produce electron beams with different sizes and properties. In the illustrated embodiment of the electron beam gun 10, both the cathode station 14 and the anode station 16 are coaxial with an electron beam column axis and are configured to rotate around their respective center of rotation. The electron beam gun 10 can have between 2 and 5 sets of cathode and anode combinations. In the example of the electron gun 10 illustrated in the FIGS. 1-4, there are 5 cathodes and 5 anodes in the rotating cathode station 14 and the rotating anode station 16 respectively, however, persons skilled in the art would understand that there can be less or more cathodes and anodes in the respective rotating cathode and anode stations without departing from the scope of the invention. In alternative embodiment of the electron beam gun a single cathode and an anode can be used as illustrated in FIG. 11.

The rotating cathode station 14 comprises a plurality of cathodes 24 (see FIGS. 2A and 2B) positioned on the rotating station 14 at a predetermined distance. Each of the plurality of cathodes 24 can be heated by a heating power supply 28 such that the cathode 24 emits thermal electrons from its emission tip 25. The heating power supply 28 can be a laser, an electrical resistance heater or any other suitable heating supply. The heater 28 and each of the cathodes 24 in the cathode station 14 have contacts (e.g., electrical contacts 26) so that when the desired cathode is connected to the heater 28 thermal electrons are emitted from its emission tip 25.

Figure 5:
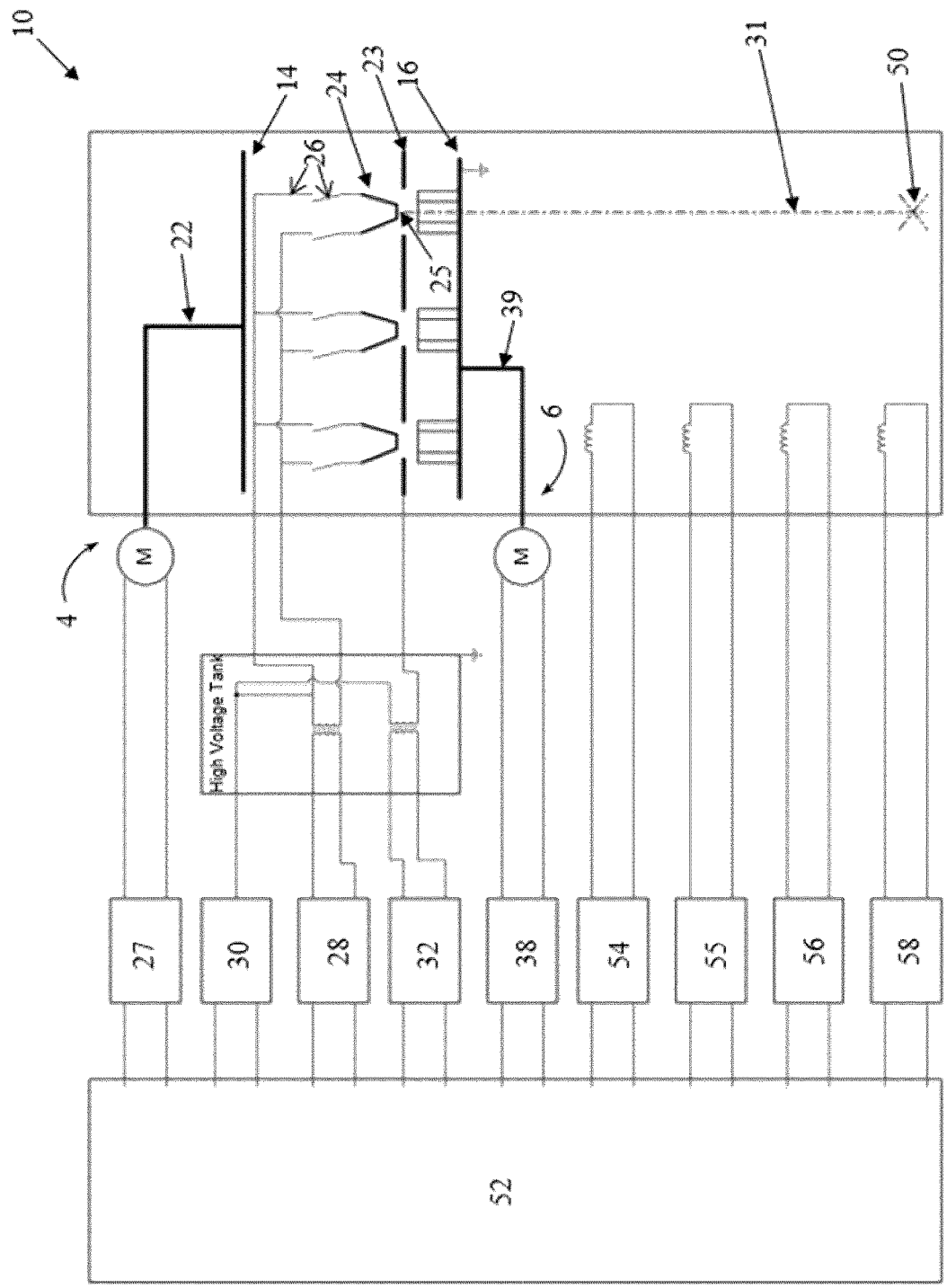
FIG. 5 is a schematic view of an example of an electron beam gun and an electron beam control system.

The cathode station 14 also comprises a plurality of bias cups 23 to control a thermal electron emission region by applying a bias voltage to the bias cup 23 to control the potential applied to the cathode. The emitted electrons have an electrical potential energy equal to the potential applied to the cathode. An electrical potential greater than the bonding potential of the cathode must be applied to the cathode to excite and release the electrons. Each of the plurality of bias cups 23 are electrically coupled to a respective cathode 24 forming a pair of cathode and bias cup. Each of the plurality of bias cups 23 has an opening 29 with a predetermined size to control the number of the thermal electrons passing through the opening 29 of the respective bias cup 23 and to focus the thermal electrons. The bias cups 23 are operatively coupled to a bias power supply 32 (see FIG. 5). The negative potential of the bias cup 23 generates an electric field on the cathode 24 and reduces the size of the cathode electron emission opening, thereby reducing the number of electrons passing through. Increasing the negative potential on the bias cup 23 can further reduce the current.

The cathode 24 can be a filament or a crystal, such as for example, a single crystal tungsten filament or a lanthanum hexaboride crystal, and is the electron source in the electron beam gun 10. The electrical potential supplied by the heater 28 (e.g., a laser or electrical power supply) is applied to the cathode 24 and determines the number of electrons emitted and their electrical potential energy. The bias cup 23 has a negative potential and generates an electrical field to reduce the number of electrons (current) released at the cathode 24. Additionally, the bias cup 23 can be used to reduce destabilization of the beam current resulting from a noise or a high voltage surges, because it is the difference in potential between the cathode 24 and the bias cup 23 that affects the number of electrons emitted from the cathode 24. Each pair of cathode/bias cup 24/23 in the cathode station 14 has the preset opening 29 and is capable to produce an electron beam 31 (see FIG. 5) with a single and uniform size. By rotating the cathode station 14, a different pair of cathode and bias cup is brought into an electrical contact to a high voltage power supply 30 and the heating supply 28, so that electron beams with different sizes can be produced by the electron beam gun 10.

The bias cup 23 can be shaped as a semi-sphere, a truncated cone, a truncated pyramid, a cylinder or any other suitable shape or combination thereof with the opening 29 in close proximity to the emission tip 25. A position of the emission tip 25 of the cathode 24 in respect to the opening 29 of the bias cup 23 depends on the selected bias voltage and current. For example, the position of the emission tip 25 of the cathode 24 can be aligned with the bias cup opening 29 such that the emission tip 25 of the cathode 24 is in a same plane with a plane of the bias cup opening 29 or the position of the emission tip 25 of the cathode 24 can be in the plane that is parallel and above or below to the plane of the bias cup opening 29. A selected acceleration voltage can be in a range between 30 kV-150 kV and the applied current can be in a range between 2-12 mA. By changing the position of the emission tip 25 of the cathode 24 one can also change a distance between the cathode 24 and a respective anode 36 (see FIG. 3) therefore changing the electrical potential differences between the cathode and anode which will determine the energy of the produced electron beam 31. The electron beam gun 10 further comprises a high voltage insulator 12 to isolate the cathode and anode stations 14, 16 and thereby prevents current jumping therein between. The cathodes 24 in the cathode station 14 are brought in communication with the heater 28 via the rotating automated beam changing system 13, such that all cathodes 24 receive energy input from the same energy source (e.g., heater 28). The operator of the electron beam gun 10 can select the cathode/bias cup pair 24/23 based on what is the desired electron beam parameters, and the cathode 24 of the selected pair will bind to the electrical contacts 26 so that the electrical supply for heating is applied. An insulator cooling 11 can also be provided in some embodiments to control the temperature in the gun 10.

Figure 4:
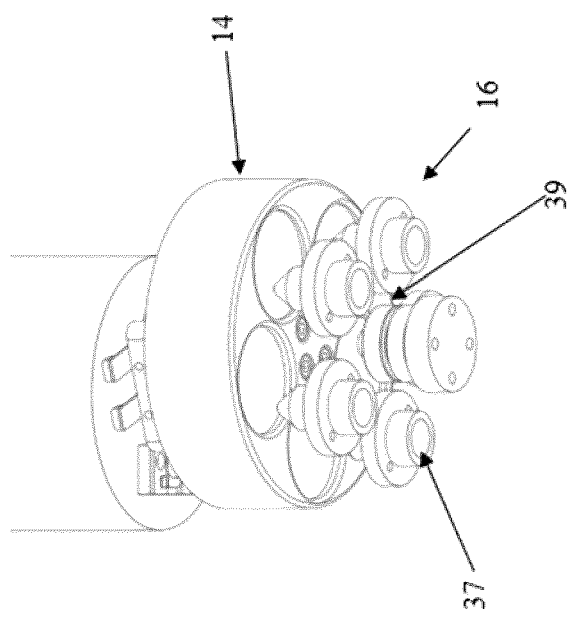
FIG. 4 is a perspective bottom view of an example of rotating cathode and anode stations in an electron beam gun of the present invention.
Figure 3:
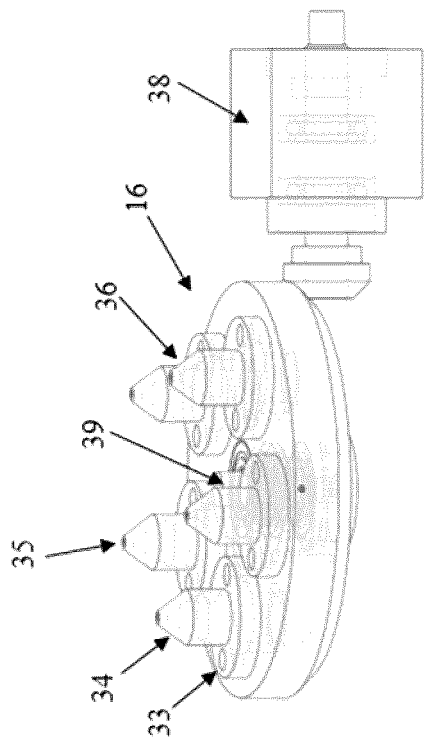
FIG. 3 is a perspective view of an example of a rotating anode station and an anode station driver.

FIGS. 3 and 4 illustrate in detail one example of the anode station 16. The anode station 16 comprises a plurality of anodes 36. Each anode 36 can comprise an anode base portion 33 with a base opening 37 (see FIG. 4) and an upper portion 34 extending upwardly from the base portion 33. The upper portion 34 has a focus opening 35 formed on the tip of the upper portion 34 to focus the thermal electrons accelerated from the cathode 24 through the anode's base opening 37. The focus opening 35 and the base opening 37 of the selected anode 36 also determines the generated electron beam size that is accelerated and focused on a predetermined position 50 (see FIG. 5) on a sample. Anode design, such as anode shape and its distance to the cathode can impact the electron trajectory. The electron beam passes through a pathway created in the anode 36 by the focus and base opening 35, 37, the size of which can control the diameter of the generated electron beam. The rotating anode station 16 has multiple anodes 36 with varying opening sizes. The largest openings size in the anode for a specific electric field will allow greatest number of electrons to pass through the anode 36 so such electron beam will have higher current.

The automated beam changing system 13 (FIG. 1) is configured to rotate the cathode station 14 and the anode station 16 and is used to select the desired cathode-anode combination, so that different cathode/anode combinations can produce electron beams with different sizes and energy. The automated beam changer 13 can comprise a rotating cathode system 14 and a rotating anode system 16 (see FIG. 5). The rotating cathode system 14 can comprise a cathode shaft 22 (see FIG. 5) onto which the cathode station 14 is mounted and a cathode driver 27 in communication with the cathode shaft 22 to rotate the cathode station 14. Similarly, the rotating anode system 16 can comprise an anode shaft 39 onto which the anode station 16 is mounted and an anode driver 38 in communication with the anode shaft 39 to rotate the anode station 16. The drivers 27 and 38 can be any suitable driver such as for example an electrical motor or any other suitable motor. The rotating cathode system (i.e., the shaft 22 and the cathode driver 27) is in contact with the rotating cathode station 14 allowing for change of cathode/bias cup pair positions. The rotating anode system (i.e., the shaft 39 and the anode driver 38) is in contacts with the rotating anode station 16 allowing for change of the anode positions. The rotating anode system 16 is synchronized with the rotating cathode system 14 to ensure accurate beam alignment using an electron beam control system 52. The control system 52 is in communication with the cathode driver 27 and the anode driver 38 to select the desired cathode-anode combination. In one implementation, the rotating cathode system 14 and the rotating anode system 16 rotate simultaneously, such that the same cathode-anode pairs are constantly aligned.

To maintain the difference in potentials between the cathode 24 and the bias cup 23, they can use the same high voltage power supply 30. The bias cup 23 can further be supplied with additional negative potential by another voltage supply through the bias voltage supply 32. By altering the bias voltage applied to the bias cup 23, the operator can control the beam current without altering the number of electrons emitted from the cathode 24. The applied additional bias voltage is controlled by the control system 52 that adjust the voltage applied to the bias cup by the bias voltage supply 32 and the high voltage power supply 30. The control system 52 can also control the electrical potential between the cathode 24 and anode 36 as well as the applied current thereto to further adjust and control the parameters of the generated electrical beam 31. The anode 36 has a positive potential and attracts the negatively charged electrons, accelerating the charged electrons through the anode. The acceleration velocity of the electrons is defined by the potential difference between the cathode and anode, known as an accelerating voltage. In addition, the potential of the anode 36 and the accelerating voltage have a direct effect on a resolution of the electron beam 31. The control system 52 is operatively coupled to the three power supplies, such as the power supply 30 to control the acceleration voltage applied between the selected cathode and anode pair (main power supply), the bias power supply 32 to control bias voltage applied to the bias cup 23 and the electron emission current and heating power supply 28 to control heating of the cathode 24.

Figure 6A:
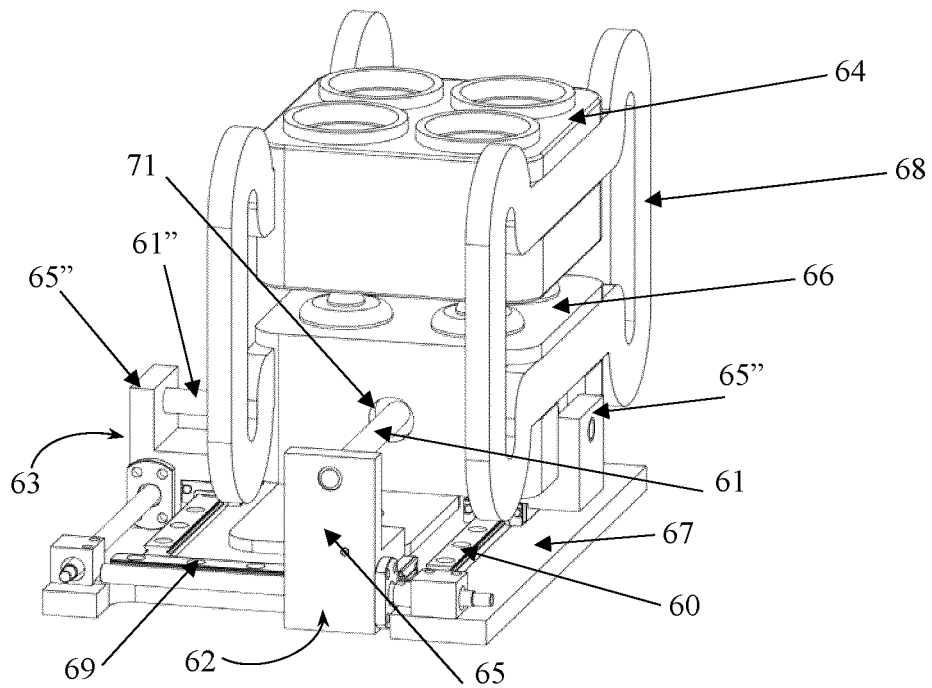
FIG. 6A is a perspective view of another example of a cathode station and an anode station mounted on a XY stage to move in X and Y directions.
Figure 6B:
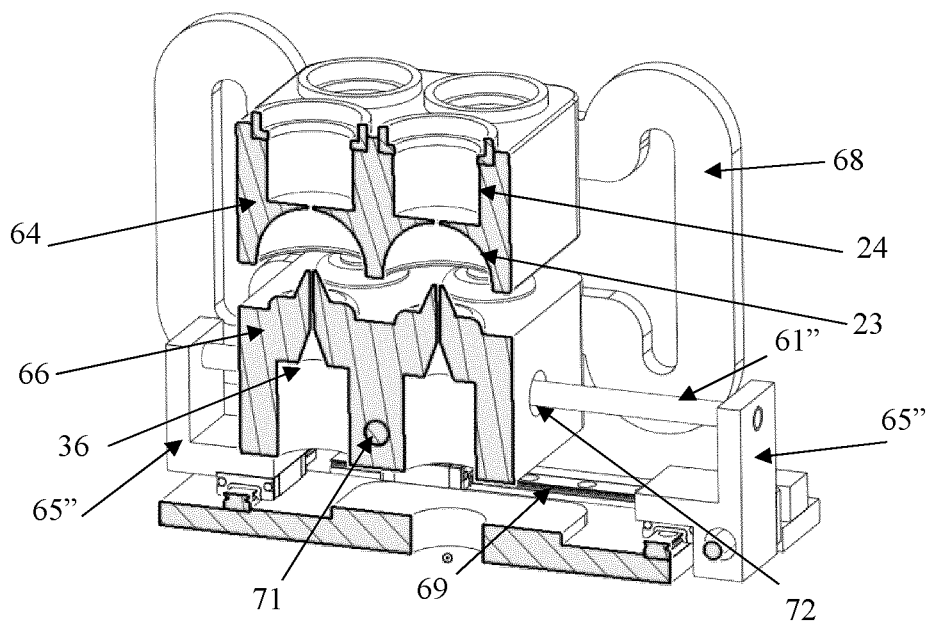
FIG. 6B is a cross-sectional view of the cathode and anode stations of FIG. 6A.

FIGS. 6A and 6B illustrate another embodiment of a moving cathode system that comprises a moving cathode station 64 and a moving anode system with a moving anode station 66. The moving cathode and anode stations are configured to move in X-direction and in Y-direction so that multiple cathode-anode combinations are provided and electron beams with different sizes and properties are produced. The moving cathode and anode stations 64 and 66 are mounted on an XY position stage 67 that comprises an X-driver 62 and a Y-driver 63. The cathode station 64 can have a plurality of cathode/bias cups 24/23 and the anode station 66 can have a plurality of anodes 36. In the illustrated embodiment, both the cathode and the anode stations 64, 66 are secured to a high voltage insulator 68 and are mounted on the same XY position stage 67 so that both the cathode and the anode stations 64, 66 can move together in X and Y directions. For example, the cathode station 64 can have four cathode/bias cups 24/23 and the anode station 66 can have four anodes 36 so that four cathode-anode combinations can be provided, and four different electron beams can be produced with the illustrated moving cathode and anode systems. In another embodiment, the cathode station 64 can be mounted on one XY position stage while the anode station 66 can be mounted on another XY position stage so that the cathode station 64 and the anode station 66 can independently move in X and Y directions.

The X-driver 62 and the Y-driver 63 can be connected to either anode station 66 or the cathode station 64 and can move both cathode and anode stations 64, 66 together at the same time. For example, and as illustrated in FIGS. 6A and 6B, the X-driver 62 and the Y-driver 63 are connected to the anode station 66. The X-driver 62 can comprise a shaft 61 and a pair of parallel sliding elements 65 that are configured to move along a respective X-path 69 formed on to opposite sides of the XY position stage 67. One end of the shaft 61 is connected to one of the sliding elements 65 while the other end of the shaft 61 is connected to the other sliding element 65. A motor (not shown) is provided to move the sliding elements along the respective X-path 69. The Y-driver 63 can also comprise a shaft 61" and a pair of parallel sliding elements 65" that are configured to move along a respective Y-path 60 formed on to opposite sides of the XY position stage 67. One end of the shaft 61" is connected to one of the sliding elements 65" while the other end of the shaft 61" is connected to the other sliding element 65". A motor (not shown) is provided to move the sliding elements 65" along the respective Y-path 60. A first passage 71 is formed in a body of the anode station sized so that the shaft 61 of the X-driver 62 passes through the first passage 71 and a second passage 72 is formed in the body of the anode station sized so that the shaft 61" of the Y-driver 63 passes therethrough so that the anode and cathode systems secured to the insulator 68 all together are mounted to the XY position stage 67. By moving the X-driver 62 along X-path 69 and Y-driver 63 along Y-path 60 different combination of cathode/anode can be aligned and brought in communication with the heater 28, the bias power supply 3, 2 and the main power supply 30 as described herein above.

Figure 7A:
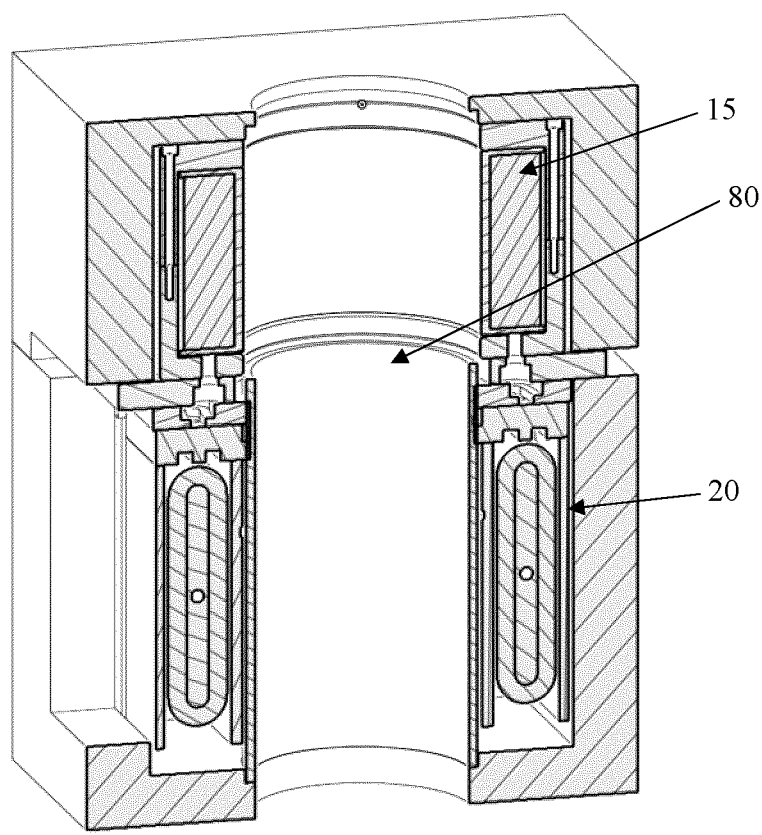
FIGS. 7A-7C show cross-sectional, perspective and top views of a deflection coil of an electron beam gun.
Figure 7B:
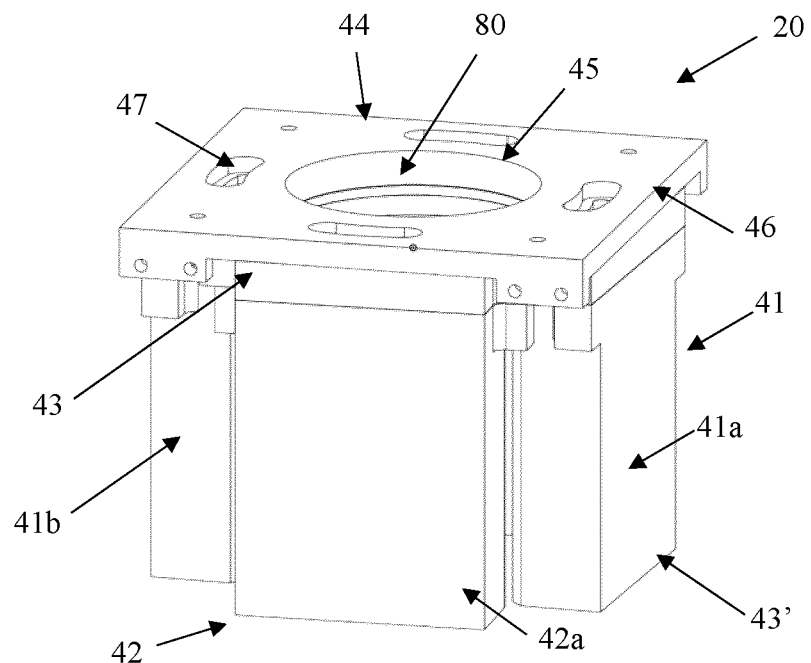
Figure 7C:
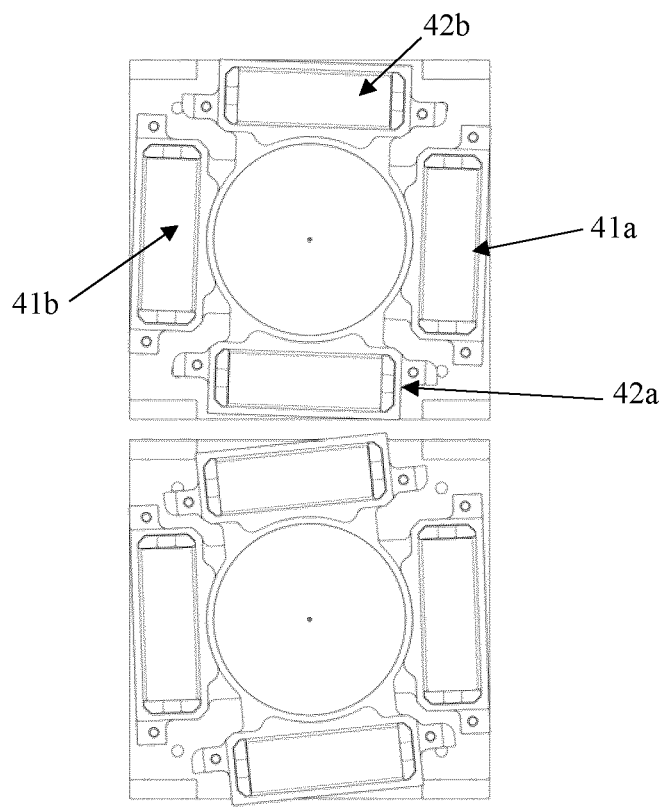

The electron beam 31 accelerated through the anode 36 has inconsistencies, such as for example has a non-circular cross-section which make it difficult to reduce the diameter of the electron beam to smaller sizes. In order to correct the beam's cross-section to a uniform circle and remove other inconsistencies and artifacts, an alignment/stigmator coil 19 (FIG. 1) is provided for astigmatism correction by changing the excitation current supplied to the alignment/stigmator coil 19. An alignment/stigmator coil amplifier 54 (see FIG. 5) supplies excitation current to the coil 19 proportional to a command signal sent from the beam control system 52. A focus coil 15 (FIG. 1) is also provided to focus the electron beam that can be diverging from the beam column axis. The focus coil 15 can surround (wound around) the beam column and produce an axial-symmetric magnetic field that can converge the electron beam to a desired focal point. A focus coil amplifier 55 that is in communication with the control system 52 supplies current to the focus coil 55, such that the amount of current supplied to the focus coil 15 can determine the focusing power of the focus coil 15 and therefore the diameter of the generated electron beam 31 on the sample. The coils are positioned outside of the beam gun column 80 (FIG. 7A) which is evacuated (under vacuum) in order to generate the electron beam. One or more vacuum valve 18 (FIG. 1) can be positioned along a length of the beam column 80 to provide the high vacuum therein. The one or more vacuum valves are in communication to a vacuum pump 21 (FIGS. 1 and 11). The electron beam accelerated through the anode 36 can be deflected by a deflection coil system 20 to adjust the impact position 50 of the electron beam 31 on the sample. The deflection coil system 20 is controlled by the control system 52 that adjusts an electron beam trajectory. Beam trajectory errors can occur when the beam deflection system 20 fails to rapidly respond to sudden position change commands triggered by the control system 52. The deflection system 20 induces a force (produced by electromagnetic coils) on the electron beam to deflect its trajectory, so that it impinges to a desired position on the sample. FIGS. 7B-7C show examples of the deflection coil system 20. The deflection coil system 20 is a Cartesian deflection system, which can comprise two deflection coil systems, such as a X-deflection coil system 41 that deflects the electron beam in X-direction and a Y-deflection coil system 42 that deflects the electron beam in Y-direction. X-deflection power amplifier 56 (FIG. 5) supplies current to the X-deflection coil system 41 and Y-deflection power amplifier 58 supplies current to the Y-deflection coil system 42. The deflections power amplifiers 56, 58 are in communication with the control system 52 that controls the current supplied to the deflection coil systems 41 and 42 and thus adjusts the beam position on the sample. Each of the deflection coil system 41, 42 controls the beam position along a separate axis. The electron beam is deflected by the force applied by the magnetic flux density generated when a current is supplied to the coil systems 41 and 42 by the current amplifiers 56 and 58.

Figure 8:
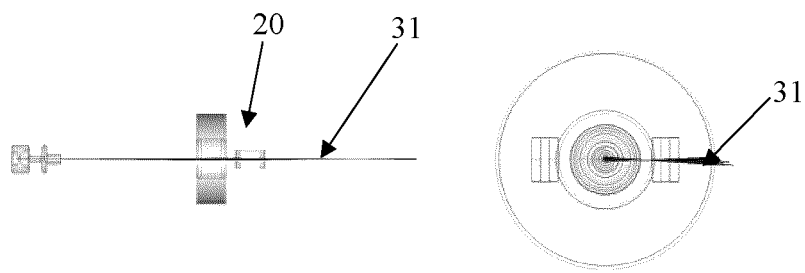
FIG. 8 is a schematic view of a Cartesian deflection coil design (upper view) of a present invention and a diagram obtained during testing showing electron beam deflection in X and Y direction with respect to Z direction.
Figure 8:
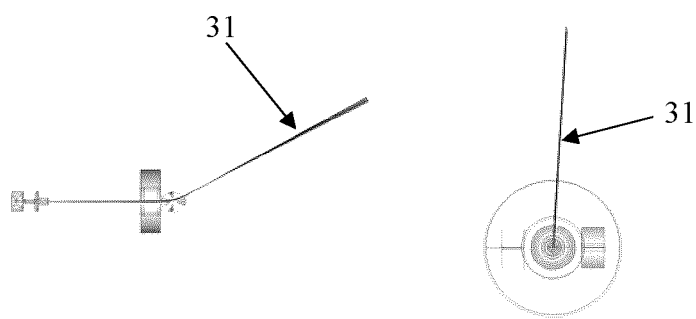
Figure 9:
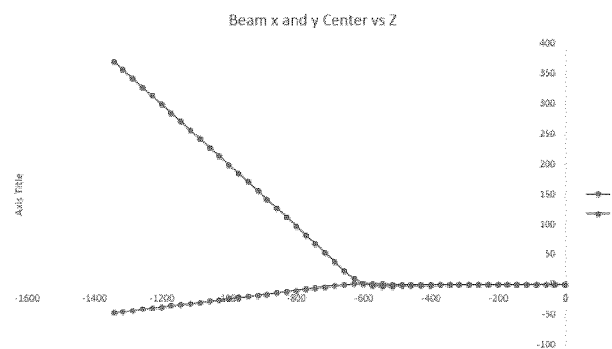
FIG. 9 shows a schematic view of a typical (prior art) deflection coil design (upper view) and a diagram obtained during testing showing electron beam deflection in X and Y direction with respect to Z direction.

As illustrated by FIGS. 7B and 7C, each of the X-deflection coil system 41 and Y-deflection coil system 42 comprise a pair of coils that are parallel or almost parallel to each other such that the two pair of coils are perpendicular or almost perpendicular to each other. The X-deflection coil system 41 comprises two deflection coils 41a and 41b that are connected in series in X-axis and the Y-deflection coil system 42 comprises two deflection coils 42a and 42b that are connected in series in Y-axis, so that the deflection system 20 in total comprises four deflection coils with each parallel pair controlling the beam position along a separate Cartesian axis. The coils 41 and 42 are positioned outside the beam gun column 80 and are connected to the deflection system base 44 at one end 43. The base 44 can have a rectangular shape with four sides 46 and an opening 45 that surrounds and is co-axial with the beam gun column 60. Each of the coils 41a and 41b are connected to the base 44 at their respective first end 43 with the second end 43' free hanging in series in X-axis and each of the coils 42a and 42b are connected to the base 44 at their respective first end 43 in series in Y-axis hanging therefrom the base 44. A position adjusting system 47 is provided to adjust angular position of each of the four coils 41a, 41b, 42a and 42b with respect to the base 44 and each other such that a magnetic field (lines) generated by one pair of coils (e.g. 41a and 41b) is perpendicular to a magnetic field (lines) generated by the other pair of coils (42a and 42b) therefore adjusting the magnetic center of the Cartesian deflection coil system to align the electron beam axis to a beam gun coordinating system. The position adjusting system 47 can be any suitable mechanical system, hydraulic system, pneumatic system or a combination thereof configured to adjust the angular position of each of the coils 41a, 41b, 42a and 42b by bringing one side of the first end 43 closer or further away from the base 44 therefore tilting the coils blocks with respect to the base 44 and each other (see FIG. 7C). For example, the position adjusting system 47 can be a mechanical system comprising a set of screws separated and at a distance connecting the base 44 and the first end 43 of each of the coils such that the angular position of each of the coils is adjusted by bringing one side of the first end 43 closer or further away from the base 44 by tightening or loosening the set of screws. By tilting (changing) the position of the coils it is not necessary that the two sets of coils in the systems 41 and 42 are perpendicular, as long as the magnetic flux (magnetic lines) generated by the X-deflection coil system 41 is perpendicular to the magnetic flux generated by the Y-deflection coil system 42. adjusting the magnetic center of the deflection coil system 20 to align the electron beam axis to the Cartesian coordinating system of the beam gun 10. By using the deflection coil system 20 with the two pairs of coils (X-deflection coil system 41 and Y-deflection coil system 42) one can accurately control the position of the electron beam in both X and Y direction. FIG. 8 illustrates the deflection coil system design 20 and the electron beam 31 (upper view) and a diagram obtained from testing showing electron beam deflection in X and Y direction with respect to Z direction on the sample. As can be seen position of the electron beam 31 on the sample is in straight line along the Y-axis (no aberration in Z direction) and along X-axis comparing to FIG. 9 that shows the typical deflection coils system known in the prior art where the position of the electron beam on the sample deviate and is not in straight line along the X and Y axes.

Figure 10:
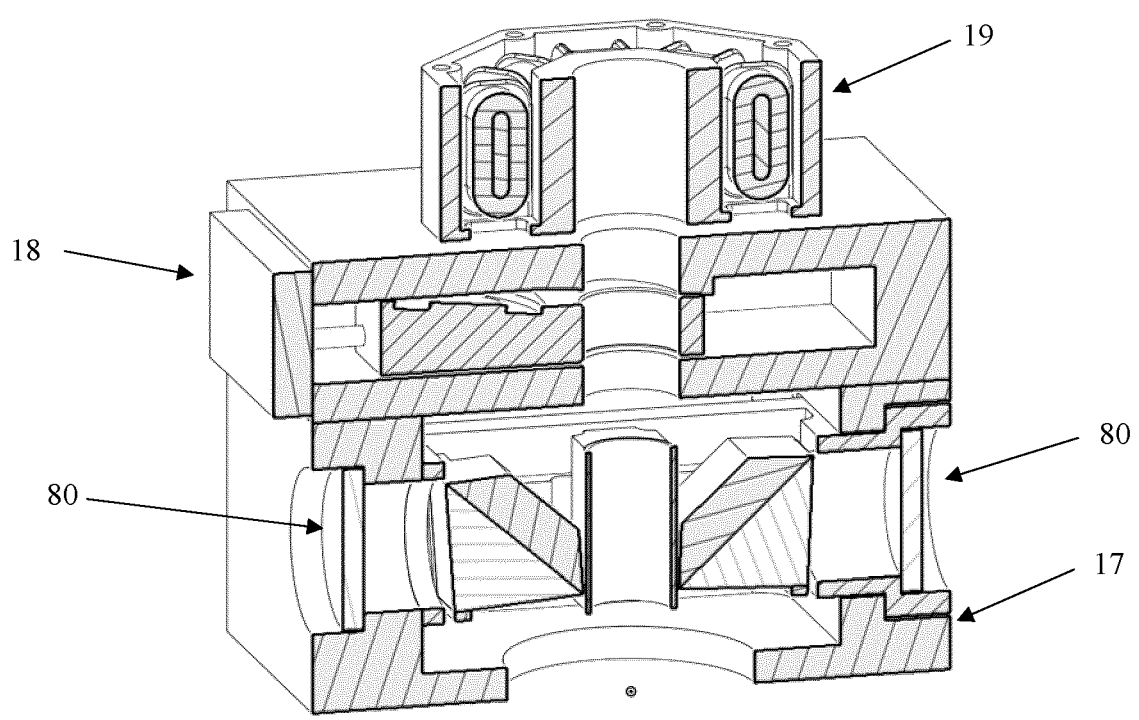
FIG. 10 is perspective cross-sectional partial view of an example of an electron beam gun showing a gun optical section with camera port.

The electron beam gun 10 can further comprises a camera port 80 (FIG. 10) and an optical system 17 so that it can be used for scanning and imaging of the sample irradiated with the electron beam, such as for example imaging of solidified layers in the powdered bed of the additive manufacturing machine. In order to be able to do scanning and imaging, the beam control system 52 can control the energy of the generated electron beam 31 by adjusting the voltage and/or the current supplied to the gun. The optical system can comprise a number of lens, mirror, or splitter such as for example visible light (VIS) and/or Infra-red (IR) optics. The electron beam 31 can be deflected by the deflection system 20 to scan on the sample. When the sample is scanned with the electron beam 31, secondary reflected or scattered electrons emanating from the sample can be detected by an electron detector that is positioned at a distal end of the gun 10. The electron detector can comprise a photo-electron multiplier or a micro channel plate (MCP) capable of directly converting the electron beam into a video signal current. The detection signal of electron detector is processed by a microprocessor so that an image signal composed of the scan signal and detection signal is formed in synchronism with scan control of the electron beam 31. An enlarged image of the scanned sample can be displayed on an image display through an image display controller.

FIG. 11 illustrates an electron beam gun 1100 with a single cathode 124/bias cup 123 and a single anode 116. The electron beam gun 100 further comprises the high voltage insulator 12 to isolate the cathode/bias cup 124/123 and anode 116 and thereby prevents current jumping therein between. The positioning of the electron beam is controlled by the electron beam deflection system 20 which induces a force, produced by electromagnetic poles, on the beam to deflect it to a desired position as described herein above. One or more vacuum valves 18 can be positioned along a length of the beam column to provide the high vacuum therein using the vacuum pump 21.

Figure 12:
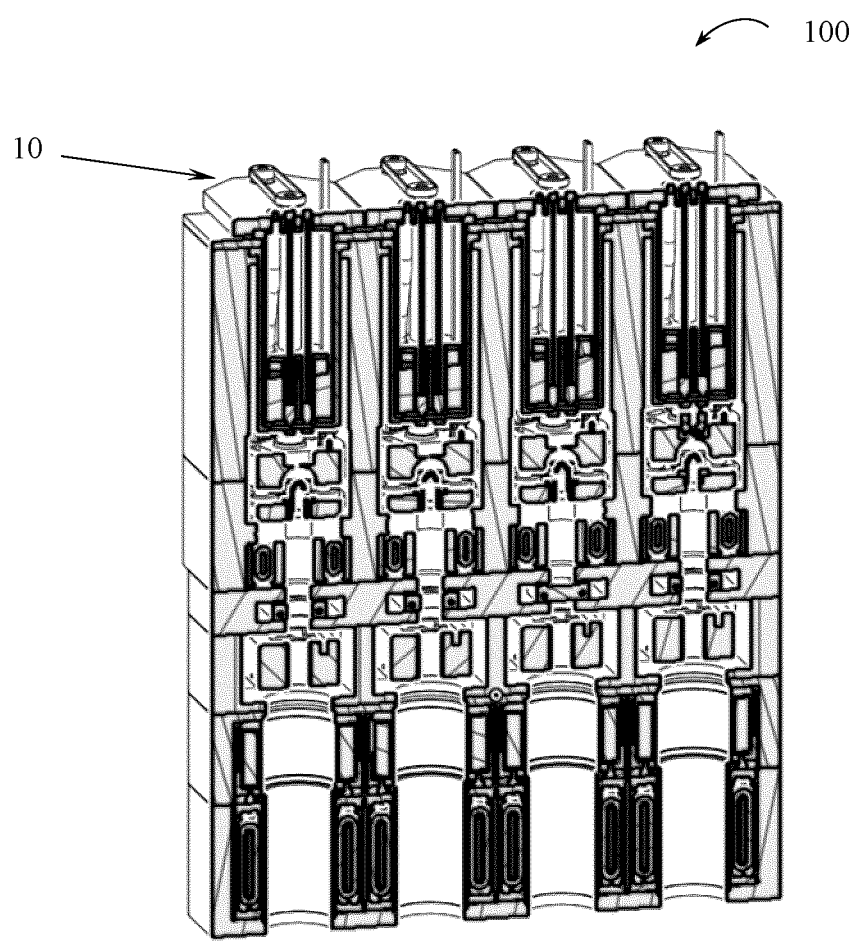
FIG. 12 is a perspective cross-sectional view of a system of multiple electron beam guns with an automated beam changing station arranged in series for use in an additive manufacturing system.
Figure 13:
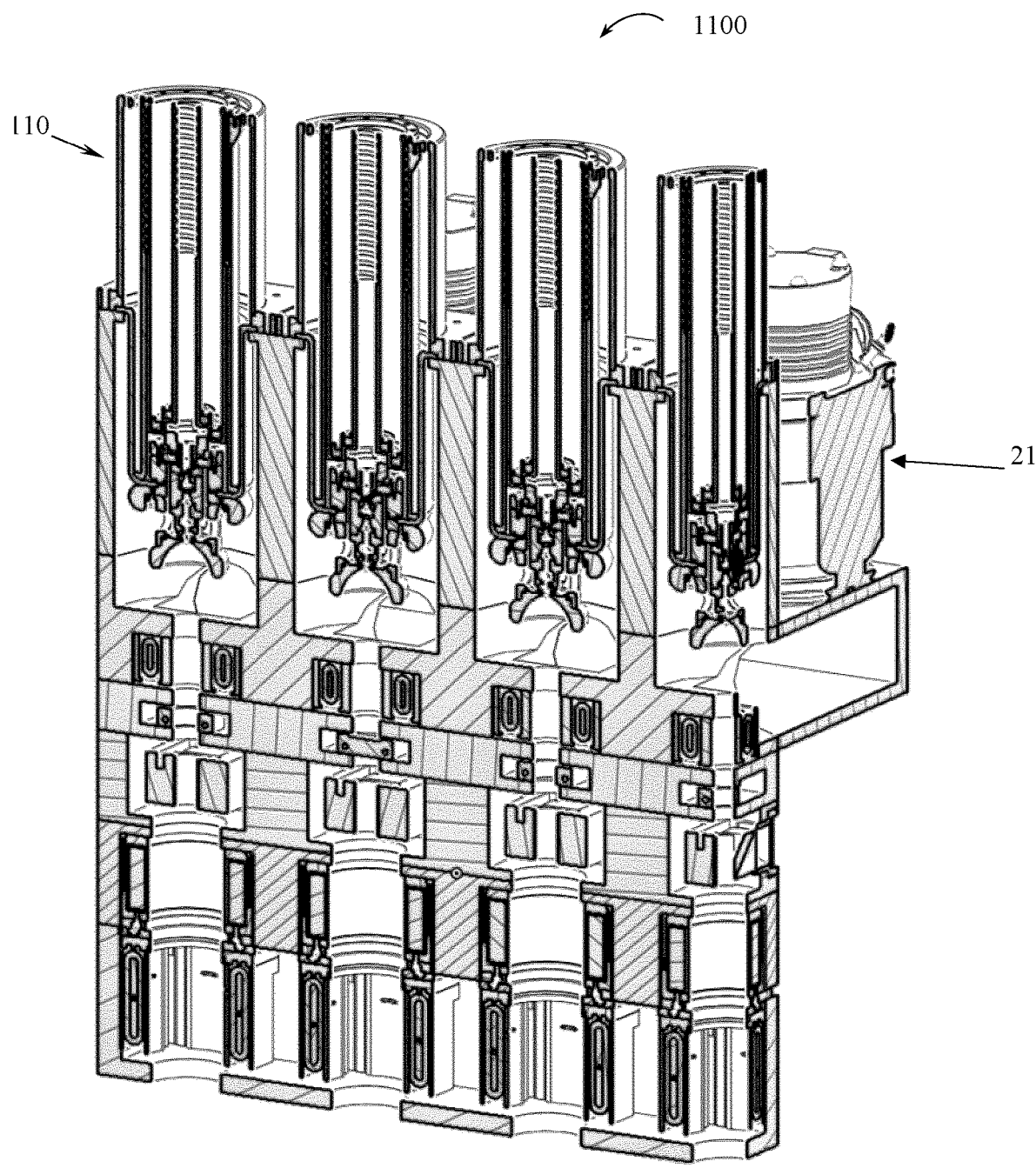
FIG. 13 is a perspective cross-sectional view of a system of multiple electron beam guns with single cathode-anode system arranged in series for use in an additive manufacturing system.

FIG. 12 illustrates a system 100 of multiple electron beam guns 10, with automated beam changer 13 and a number of moving cathode station 14 and a moving anode station 16, which can be arranged in series (as in the illustrated example) or in parallel. FIG. 13 illustrates a system 1100 of multiple electron beam guns 110, with single cathode system 123/124 and a single anode 116, which can be arranged in series (as in the illustrated example) or in parallel. In one implementation the system of multiple electron beam guns 10, 110 can be used in an additive manufacturing system and using multiple electron beam guns 10, 110, multiple parts can be printed simultaneously at the same time.

Figure 14:
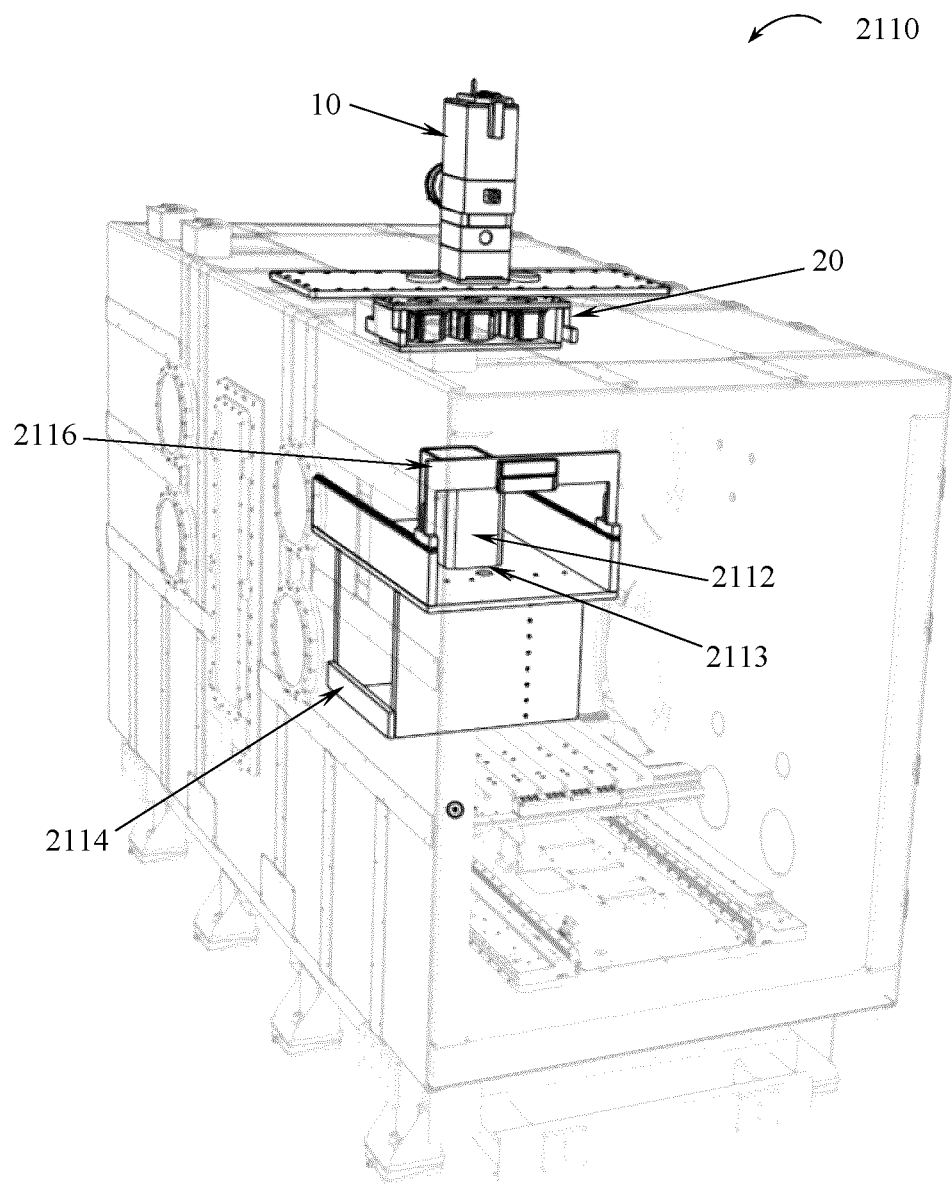
FIG. 14 is a perspective view of an example of an additive manufacturing system showing inside components of the additive manufacturing system.

An example of an additive manufacturing system 2110 is shown in FIG. 14. The additive manufacturing system 2110 can use an electron beam gun 10, 110 described herein above. The additive manufacturing system 2110 can be a laser additive manufacturing system. An example of a laser additive manufacturing system is described in detail in the co-pending international patent application publication number WO2021/092680 incorporated herein by reference in its entirety. The system 2110 comprises a build chamber 2112 with a build plate 2113 that is at least partially evacuated to be under high vacuum. The build plate is operatively coupled to a build plate driver 2114 that moves the build plate in Z-direction. A powder bed is defined on the build plate. A powder feeder 2116 with an inner cavity containing a powdered material and a dispensing opening is configured to dispense the powdered material onto the powder bed. The powder feeder is used to evenly distribute the powdered material on the powder bed. An example of powder feeder for dispensing powdered material is disclosed in the co-pending US patent application publication number 20210260666 incorporated herein by reference in its entirety. The electron gun 10, 110 is configured to generate and deliver an electron beam with a pre-determined energy and diameter to a predetermined position on the powder bed to melt the powdered material forming melting pools. The system can further include a build plate heater to preheat the build plate or the previously printed layer. In some embodiments the dispensed powdered material can also be preheated. Preheating is required because the electron beam can travel through a buildup of charge that occurs on the metal powder particles caused by the dielectric oxide layer formed on the powder surface. These oxides will absorb the beam's electrons and charge the metal powders. When the charge reaches a threshold, the produced voltage will discharge to the ground and result in an energy charge which ejects the powder from the build surface. This displacement of powder will result in defective structures. The positioning of the electron beam is controlled by the electron beam deflection system 20 which induces a force, produced by electromagnetic poles, on the beam to deflect it to a desired position. As the electron beam moves along the powder bed multiple melt pools are formed. The control system 52 controls the electron beam energy input, the focal point of the generated electron beam and its position as described herein above. The controller 52 can also control the drivers of the rotating cathode and anode rotating stations, and the driver of the build plate such that an electron beam with a predetermined size and parameters is generated and the position of the build plate is adjusted in Z-direction. Since the diameter of the electron beam focused onto the powdered bed varies it will produce melting pools with varying dimensions. For example, an electron beam with bigger diameter can be focused at first focal positions on the powder bed and an electron beam with smaller diameter (generated with a finer cathode/bias cup and anode pair) can be focused at second focal positions on the powder bed. In one implementation, at the outlines of the powder bed, electron beam with bigger diameter can be generated and positioned to form inner hatch melting pools while the outer contour area can be melted with finer (smaller diameters) electron beams. The operator can at any time through the control system 52 trigger the imaging system to adjust the energy of the generated beam and activate the electron detector to scan the produced layer on the powder bed to inspect such layer for any deformity. If no deformity is found, the electron detector is deactivated. This deactivates the imaging mode of the electron gun 10, turns on the operation mode of the electron beam gun, and drives the building plate to the next position in Z-direction upon which new layer of powdered material is dispersed.

While particular elements, embodiments and applications of the present disclosure have been shown and described, it will be understood, that the scope of the disclosure is not limited thereto, since modifications can be made by those skilled in the art without departing from the scope of the present disclosure, particularly in light of the foregoing teachings. Thus, for example, in any method or process disclosed herein, the acts or operations making up the method/process may be performed in any suitable sequence and are not necessarily limited to any particular disclosed sequence. Elements and components can be configured or arranged differently, combined, and/or eliminated in various embodiments. The various features and processes described above may be used independently of one another, or may be combined in various ways. All possible combinations and subcombinations are intended to fall within the scope of this disclosure. Reference throughout this disclosure to "some embodiments," "an embodiment," or the like, means that a particular feature, structure, step, process, or characteristic described in connection with the embodiment is included in at least one embodiment. Thus, appearances of the phrases "in some embodiments," "in an embodiment." or the like, throughout this disclosure are not necessarily all referring to the same embodiment and may refer to one or more of the same or different embodiments. Indeed, the novel methods and systems described herein may be embodied in a variety of other forms: furthermore, various omissions, additions, substitutions, equivalents, rearrangements, and changes in the form of the embodiments described herein may be made without departing from the spirit of the inventions described herein.

Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without operator input or prompting, whether these features, elements and/or steps are included or are to be performed in any particular embodiment. No single feature or group of features is required for or indispensable to any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

The example calculations, simulations, results, graphs, values, and parameters of the embodiments described herein are intended to illustrate and not to limit the disclosed embodiments. Other embodiments can be configured and/or operated differently than the illustrative examples described herein.

The invention claimed is:

1. An electron beam system comprising:
an electron gun comprising:
a heating power supply with an electrical contact for cathode heating;
a high voltage power supply;
a bias voltage power supply;
a moving cathode station comprising:
a plurality of cathodes positioned on the moving station at a predetermined distance and heated by the heating power supply, each of the plurality of cathodes configured to emit thermal electrons from an emission tip; and
a plurality of bias cups, the plurality of cathodes and the plurality of bias cups operatively coupled to the bias voltage power supply to control a thermal electron emission region by applying a bias voltage to the bias cup, each of the plurality of bias cups electrically coupled to a respective cathode forming a pair of cathode and bias cup in the cathode station, each of the plurality of bias cups having an opening with a predetermined size to control a number of the thermal electrums passing through the opening of the respective bias cup and to focus the thermal electrons;
a moving anode station comprising:
a plurality of anodes having a base portion with a base opening and an upper portion extending upwardly from a base portion having a focus opening to focus the thermal electrons accelerated from the cathode through the anode's openings;
an automated beam changer configured to move the cathode station and the anode station comprising:
a cathode station system comprising a driver in communication with the moving cathode station to move the cathode station to connect a desired cathode and bias cup pair with the electrical contacts of the heating power supply; and
an anode station system comprising a driver in communication with the moving anode station to move the anode station such that a position of a selected anode in the anode station is aligned with a position of a respective matching pair of cathode and bias cup of the cathode station to generate an electron beam with predetermined dimensions and parameters; and
a controller configured to control a bias voltage between the cathode and the matching bias cup in the cathode station, voltage and current limit provided to the electron beam gun by the high voltage power supply and to control the drivers of the rotating cathode and anode rotating stations to synchronize and align a predetermined cathode and bias cup pair to a predetermined anode to control the parameters of the generated electron beam.

2. The electron beam system of claim 1, wherein the moving cathode station is a rotating cathode station rotating around its center of rotation and the moving anode station is a rotation anode station rotating around its center of rotation.

3. The electron beam system of claim 1, wherein the moving cathode station moves along X-direction and Y-direction, and the moving anode station moves along X-direction and Y-direction.

4. The electron beam system of claim 1, wherein the bias cup is shaped as a semi-sphere, a truncated cone, a truncated pyramid or a cylinder.

5. The electron beam system of claim 1, wherein a position of the emission tip of the cathode is aligned with the bias cup opening such that the emission tip of the cathode is in a same plane with a plane of the bias cup opening.

6. The electron beam system of claim 1, wherein a position of the emission tip of the cathode is in a plane that is parallel and above or below to a plane of the bias cup opening.

7. The electron beam system of claim 1, wherein the controller adjusts a position of the emission tip of the cathode in respect to the opening of the bias cup depending on a selected bias voltage and current.

8. The electron beam system of claim 1, wherein a selected acceleration voltage applied by the high voltage power supply is in a range between 30 kV-150 kV and a preselected current is in a range between 2-12 mA, and wherein the applied bias voltage to the bias cup is in a range between 10 to 2000 V.

9. The electron beam system of claim 1, further comprising a deflection coil positioned outside a beam column and coaxial with the electron beam, the deflection coil operatively coupled to a coil power amplifier to get excitation current supply, the deflection coil when excited generating electromagnetic force applied to the electron beam adjusting a position of the electron beam when impinging on a sample.

10. The electron beam system of claim 9, wherein the deflection coil is a Cartesian deflection coil comprising a X-deflection coil system in communication with a X-deflection coil current amplifier configured to deflect the electron beam position in a X-direction and a Y-deflection coil system in communication with a Y-deflection coil current amplifier configured to deflect the electron beam position in a Y-direction.

11. The electron beam system of claim 10, wherein each of the X-deflection coil system and the Y-deflection coil system comprise a pair of coils that are parallel or almost parallel to each other such that the two pair of coils are perpendicular or almost perpendicular to each other, the Cartesian deflection coil further comprising a rectangular base with four sides and an opening surrounding and coaxial with the beam column, the coils of the X-deflection coil system connected to respective side of the base in series in X-axis and the coils of the Y-deflection coil system connected to respective side of the base in series in Y-axis, each of the coils connected to the base at their respective first end and hanging therefrom, a position adjusting system configured to connect the two pair of the deflection coils to the base and to adjust an angular position of the coils with respect to the base such that a magnetic field (lines) generated by the X-deflection coils is perpendicular to a magnetic field (lines) generated by the Y-deflection coils therefore adjusting a magnetic center of the Cartesian deflection coil system to align the electron beam axis to a beam gun coordinating system.

12. The electron beam system of claim 11, wherein the position adjusting system is any of a mechanical system, a hydraulic system, a pneumatic system or a combination thereof configured to adjust the angular position of each of the coils by bringing one side of the coils' first end closer or further away from the base therefore tilting the coils to a preset position.

13. The electron beam system of claim 12, wherein the position adjusting system is mechanical system comprising a set of screws separated and at a distance connecting the base and the first end of each of the coils such that an angular position of each of the coil is adjusted by bringing one side of the first end closer or further away from the base by tightening or loosening the set of screws.

14. The electron beam system of claim 1, further comprising an imaging system including an optical system to align, filter and focus the electron beam, an electron detector, a camera port and a microprocessor, the imaging system in communication with the controller to adjust the energy of the generated electron beam when the electron gun is in a scanning and imaging mode and to activate the electron detector.

15. The electron beam system of claim 14, wherein the electron detector a photo-electron multiplier or a micro channel plate electrically connected to a detector power supply, the electron detector configured to convert detected electrons into a video signal current which is processed by the microprocessor and an enlarged image of the scanned sample can be displayed on an image display.

16. The electron beam system of claim 14, wherein the electron detector is positioned at a distal end of the electron gun.

17. The electron beam system of claim 14, wherein the optical system is VIS/IR optical system comprising at least one of a mirror, lens, beam splitter, screen or a combination thereof.

18. The electron beam system of claim 1, further comprising a high voltage insulator to electrically isolate the cathode station from the electron gun.

19. The electron beam system of claim 1, further comprising:
   a building chamber with a build plate operatively coupled to the electron gun;
   a driver operatively coupled to the build plate to move the build plate in Z-direction, a powder bed is defined on the build plate;
   a powder feeder having an inner cavity and a dispensing opening for dispensing a powdered material onto the powder bed; and
   a controller for setting the voltage and current limit provided to the electron beam gun, the bias voltage and to control the drivers of the moving cathode and anode moving stations, and the driver of the build plate such that an electron beam with a predetermined size and parameters is generated and the position of the build plate is adjusted in Z-direction,
   wherein a diameter of the electron beam focused onto the powdered bad varies producing melt pools with varying dimensions such that an electron beams generated with a bigger cathode and bias cup pair are focused at first focal positions on the powder bed and an electron beam generated with a finer cathode and bias cup pair are focused at second focal positions on the powder bed.

20. A method for generating electron beam comprising:
   moving a cathode station that comprises a plurality of pairs of cathodes and bias cups to bring a selected pair of cathode and bias cup into contact with a heating power supply;
   emitting thermal electrons from an emission tip of the cathode;
   applying a bias voltage to the bias cup supply to control a thermal electron emission region;
   moving anode station with a plurality of anodes to align a desire anode to the selected cathode and bias cup pair;
   synchronizing movement of the anode station with movement of the cathode station for accurate beam alignment by controlling drivers of the moving cathode and anode moving stations, and setting of the bias voltage; and
   adjusting a position of the electron beam when impinging on a sample by generating an electromagnetic field using an deflection coil,
   wherein each of the plurality of pairs of cathodes and bias cups and the matching anode generate an electron beam with predetermined dimension such that by varying the aligned cathode and bias cup pair and anode the electron gun can generate electron beams with varying dimensions.

21. A method for additive manufacturing comprising:
   moving a cathode station that comprises a plurality of pairs of cathodes and bias cups to bring a selected pair of cathode and bias cup into contact with a heating power supply;
   emitting thermal electrons from an emission tip of the cathode;
   applying a bias voltage to the bias cup supply to control a thermal electron emission region;
   moving anode station with a plurality of anodes to align a desire anode to the selected cathode and bias cup pair;
   synchronizing movement of the anode station with movement of the cathode station for accurate beam alignment by controlling drivers of the moving cathode and anode moving stations, and setting of the bias voltage;
   adjusting a position of the electron beam when impinging on a powder bed by generating an electromagnetic field using an deflection coil;
   dispensing a powdered material onto the powder bed;
   adjusting a position of a build plate and the powder bed in z-direction; and
   selecting between an additive manufacturing mode or an imaging control mode to adjust an energy of generated electron beam.

* * * * *